(12) United States Patent
Lin

(10) Patent No.: US 9,130,277 B2
(45) Date of Patent: Sep. 8, 2015

(54) RF BASEBAND BEAMFORMING

(75) Inventor: Saihua Lin, Sunnyvale, CA (US)

(73) Assignee: QUALCOMM Incorporated, San Diego, CA (US)

( * ) Notice: Subject to any disclaimer, the term of this patent is extended or adjusted under 35 U.S.C. 154(b) by 502 days.

(21) Appl. No.: 13/406,282

(22) Filed: Feb. 27, 2012

(65) Prior Publication Data

US 2013/0222183 A1    Aug. 29, 2013

(51) Int. Cl.
*H01Q 3/00* (2006.01)
*H01Q 3/42* (2006.01)
*H03H 11/02* (2006.01)
*H03H 11/20* (2006.01)
*H04B 7/06* (2006.01)
*H04B 7/08* (2006.01)

(52) U.S. Cl.
CPC .......... *H01Q 3/42* (2013.01); *H03H 11/02* (2013.01); *H03H 11/20* (2013.01); *H04B 7/0617* (2013.01); *H04B 7/086* (2013.01)

(58) Field of Classification Search
CPC ....... H01Q 3/00; H03H 11/20; H04B 7/0617; H04B 7/086
USPC ........................................................ 342/368
See application file for complete search history.

(56) References Cited

U.S. PATENT DOCUMENTS

| 4,638,269 A | 1/1987 | Dawson et al. |
| 5,228,006 A | 7/1993 | Sheriff |
| 5,548,561 A | 8/1996 | Hussain et al. |
| 7,760,833 B1 | 7/2010 | Brunner |
| 7,812,775 B2 | 10/2010 | Babakhani et al. |
| 7,915,941 B1 | 3/2011 | Pan et al. |
| 7,917,091 B2 | 3/2011 | Montemayor et al. |
| 7,961,025 B2 | 6/2011 | Rylov |
| 7,990,298 B1 | 8/2011 | Friedmann et al. |
| 2005/0147194 A1 | 7/2005 | Koenenkamp |
| 2007/0160168 A1* | 7/2007 | Beukema et al. ............. 375/326 |
| 2008/0164917 A1 | 7/2008 | Floyd et al. |
| 2009/0310712 A1 | 12/2009 | Nakatani |
| 2010/0026367 A1 | 2/2010 | Jiang |
| 2010/0029223 A1 | 2/2010 | Tang et al. |
| 2010/0109734 A1* | 5/2010 | Rylov ............................ 327/256 |
| 2010/0329403 A1 | 12/2010 | Beukema et al. |

(Continued)

FOREIGN PATENT DOCUMENTS

JP       2007150646 A    6/2007
WO        0184702 A2    11/2001

OTHER PUBLICATIONS

Aerts W. et al., "Conceptual Study of Analog Baseband Beam Forming: Design and Measurement of an Eight-by-Eight Phased Array", IEEE Transactions on Antennas and Propagation, Jun. 1, 2009, IEEE Service Center, Piscataway, NJ, US, vol. 57, No. 6, pp. 1667-1672, XP011261762, ISSN: 0018-926X.

(Continued)

Primary Examiner — Harry Liu

(57) ABSTRACT

Exemplary embodiments are directed to beamforming. A device may include a plurality of mixers, wherein each mixer is configured to receive at least one of a quadrature signal and an in-phase signal. The device may further include at least one RF phase rotator coupled to an output of each of the plurality of mixers and configured for rotating an envelope of the at least one of the quadrature signal and the in-phase signal to generate at least one of a rotated in-phase signal and a rotated quadrature signal.

24 Claims, 10 Drawing Sheets

(56) References Cited

U.S. PATENT DOCUMENTS

| | | |
|---|---|---|
| 2011/0076944 A1 | 3/2011 | Mihota |
| 2012/0013388 A1 | 1/2012 | Couzin |
| 2013/0093624 A1 | 4/2013 | Raczkowski et al. |
| 2013/0223486 A1 | 8/2013 | Lin et al. |

OTHER PUBLICATIONS

Afsahi, et al., "An Area and Power Efficient Cartesian Phase Shifter + Mixer Circuit Applied to WLAN System," 2007 IEEE Radio Frequency Integrated Circuits (FRIC) Symposium, pp. 357-360.

International Search Report and Written Opinion—PCT/US2013/028105—ISA/EPO—Aug. 21, 2013.

Mesecher D K: "A physical layer open architecture for communications systems integration: Common baseband processor with multiple-access adaptively steered antenna array", Systems, Applications and Technology Conference, 2008 IEEE Long Island, IEEE, Piscataway, NJ, USA, May 2, 2008, pp. 1-10, XP031344947, ISBN: 978-1-4244-1731-5.

Sjöland. "From sub-VT RF to mm-wave CMOS Circuits". [Online] 2010. http://cdworkshop.eit.lth.se/fileadmin/cdworkshop/2010/Sjoland-RF.pdf (accessed Aug. 17, 2011). See pp. 14-16.

Tabesh, et al., "A 65nm CMOS 4-Element Sub-34mW/Element 60GHz Phased-Array Transceiver," 2011 IEEE International Solid-State Circuits Conference Digest of Technical Papers, ISSCC 2011, pp. 166-168.

Cohen, et al., "A thirty two element phased-array transceiver at 60GHz with RF-IF conversion block in 90nm flip chip CMOS process," 2010 IEEE Radio Frequency Integrated Circuits Symposium (RFIC), 2010, pp. 457-460.

Natarajan et al. "A 77-GHz Phased-Array Transceiver with On-Chip Antennas in Silicon: Transmitter and Local LO-Path Phase Shifting". IEEE Journal of Solid-State Circuits [Online] 2006, vol. 41, Issue 12, pp. 2807-2819. See pp. 2807, 2810, and 2813.

Valdes-Garcia, et al., "A Fully Integrated 16-Element Phased-Array Transmitter in SiGe BiCMOS for 60-GHz Communications," IEEE Journal of Solid-State Circuits, vol. 45, No. 12, Dec. 2010, pp. 2757-2773.

\* cited by examiner

RF BASEBAND BEAMFORMING

REFERENCE TO CO-PENDING APPLICATIONS FOR PATENT

This application is also related to the following application, which is assigned to the assignee hereof and filed on even date herewith, the disclosure of which is incorporated herein in its entirety by reference:

U.S. patent application Ser. No. 13/406,242, entitled "RF BASEBAND BEAMFORMING", filed simultaneously with this application on Feb. 27, 2012.

BACKGROUND

1. Field

The present invention relates generally to beamforming. More specifically, the present invention relates to systems, devices, and methods for RF beamforming in millimeter wave applications.

2. Background

As will be appreciated by a person having ordinary skill in the art, beamforming in millimeter wave applications presents many challenges. As one example, a 60 GHz signal may have approximately 20 dB more loss than a 2.4 GHz signal at a distance of approximately one meter. One solution to the problem of loss may include increasing an output power of a power amplifier. However, this solution may be limited by a low supply voltage, a low breakdown voltage, a lossy substrate, low-Q passive components, and the low intrinsic gain of CMOS transistors.

A need exists for methods, systems, and devices to enhance beamforming in millimeter wave applications.

DETAILED DESCRIPTION

The detailed description set forth below in connection with the appended drawings is intended as a description of exemplary embodiments of the present invention and is not intended to represent the only embodiments in which the present invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well-known structures and devices are shown in block diagram form in order to avoid obscuring the novelty of the exemplary embodiments presented herein.

As will be understood by a person having ordinary skill in the art, in conventional point-to-point communication, a large amount of energy may be wasted when utilizing a one antenna solution. Accordingly, various array architectures (i.e., an array of antennas), which may focus energy in a spatial domain, are well known in the art.

Figure 1:
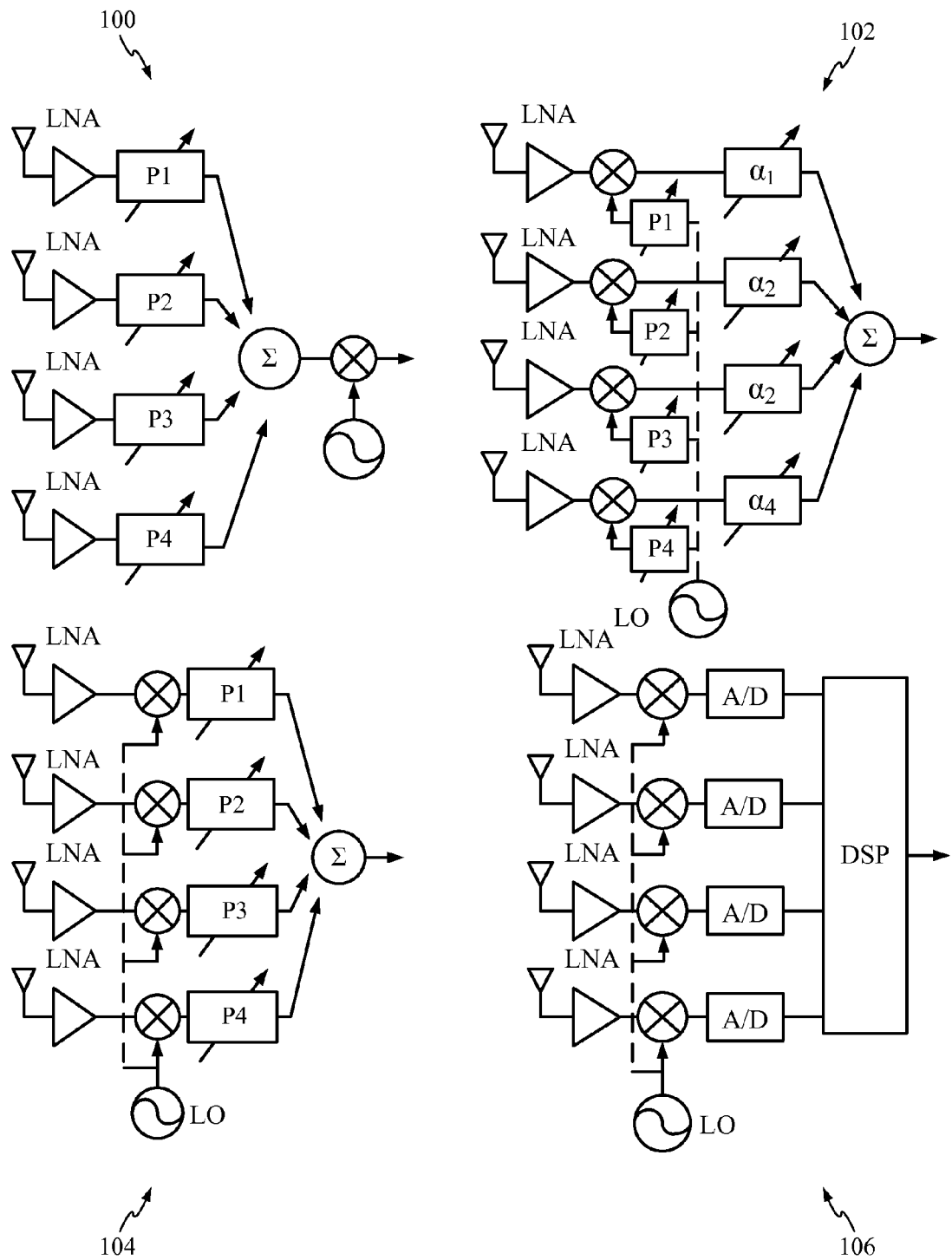
FIG. 1 depicts various beamforming array architectures.

FIG. 1 illustrates various beamforming array architectures. Although FIG. 1 illustrates various receiver-based beamforming array architectures, one having ordinary skill will understand transmitter-based beamforming array architectures. Specifically, reference numeral 100 indicates a radio frequency (RF) path beamforming architecture, reference numeral 102 indicates an local oscillator (LO) path beamforming architecture, reference numeral 104 indicates an intermediate frequency (IF) path beamforming architecture, and reference numeral 106 indicates a digital domain architecture.

As will be understood, radio frequency (RF) path beamforming may utilize a small area and low power. Further, RF path beamforming may exhibit a good signal-to-noise ratio (SNR) and a good signal to interference-plus-noise ratio (SINR). However, challenges of RF path beamforming include designing for a high linearity, wide band, low loss, and low-area RF phase shifter. Further, LO path beamforming may exhibit low sensitivity to LO amplitude variations. On the other hand, challenges of LO path beamforming include design of a large LO network, and it may be difficult to generate a millimeter wave LO signal. IF path beamforming may exhibit good linearity and may utilize a low power phase shifter. However, IF path beamforming includes less component sharing and a large LO network. Further, offset calibration may be difficult due to multiple mixers. Additionally, although a digital domain architecture may be versatile, it may require a fast digital signal processor and may exhibit high power consumption.

Conventional beamforming systems may require a pair of mixers for each antenna within an array. For example, an array having two antennas may require four mixers (i.e., two I filters and two Q filters) and an array having four antennas may require eight mixers. According to various exemplary embodiments of the present invention, only four mixers (i.e., two pairs) are required regardless of the number of antenna paths. Further, a four-phase LO signal may not be required.

As will be understood by a person having ordinary skill in the art, for analog baseband beamforming:

$$\begin{bmatrix} I' \\ Q' \end{bmatrix} = \begin{bmatrix} \cos\omega_c t & 0 \\ 0 & \sin\omega_c t \end{bmatrix} \begin{bmatrix} \cos\theta & -\sin\theta \\ \sin\theta & \cos\theta \end{bmatrix} \begin{bmatrix} I \\ Q \end{bmatrix}; \quad (1)$$

$$I' = \cos\omega_c t [\cos\theta \quad -\sin\theta] \begin{bmatrix} I \\ Q \end{bmatrix}; \text{ and} \quad (2)$$

$$Q' = \sin\omega_c t [\sin\theta \quad \cos\theta] \begin{bmatrix} I \\ Q \end{bmatrix}. \quad (3)$$

Further, for RF baseband beamforming:

$$\begin{bmatrix} I' \\ Q' \end{bmatrix} = \text{diag}\left\{ \begin{bmatrix} \cos\theta & -\sin\theta \\ \sin\theta & \cos\theta \end{bmatrix} \begin{bmatrix} I \\ Q \end{bmatrix} [\cos\omega_c t \quad \sin\omega_c t] \right\}; \quad (4)$$

$$I' = \cos\omega_c t [\cos\theta \quad -\sin\theta] \begin{bmatrix} I \\ Q \end{bmatrix}; \text{ and} \quad (5)$$

$$Q' = \sin\omega_c t [\sin\theta \quad \cos\theta] \begin{bmatrix} I \\ Q \end{bmatrix}. \quad (6)$$

Further, an output signal "Signal$_{Tx,out}$," which is the same for both baseband and RF beamforming, is equal to I'+Q'. Accordingly, as will be appreciated by a person having ordinary skill in the art, analog baseband beamforming and RF baseband beamforming each utilize baseband beamforming techniques and, thus, analog baseband beamforming generates substantially the same output as compared to RF baseband beamforming.

Exemplary embodiments of the present invention include devices, systems, and methods for RF baseband beamforming. In contrast to conventional RF beamforming wherein a carrier signal may be shifted, exemplary embodiments may provide for RF baseband beamforming wherein a baseband signal (i.e., an envelope) is shifted.

Figure 2A:
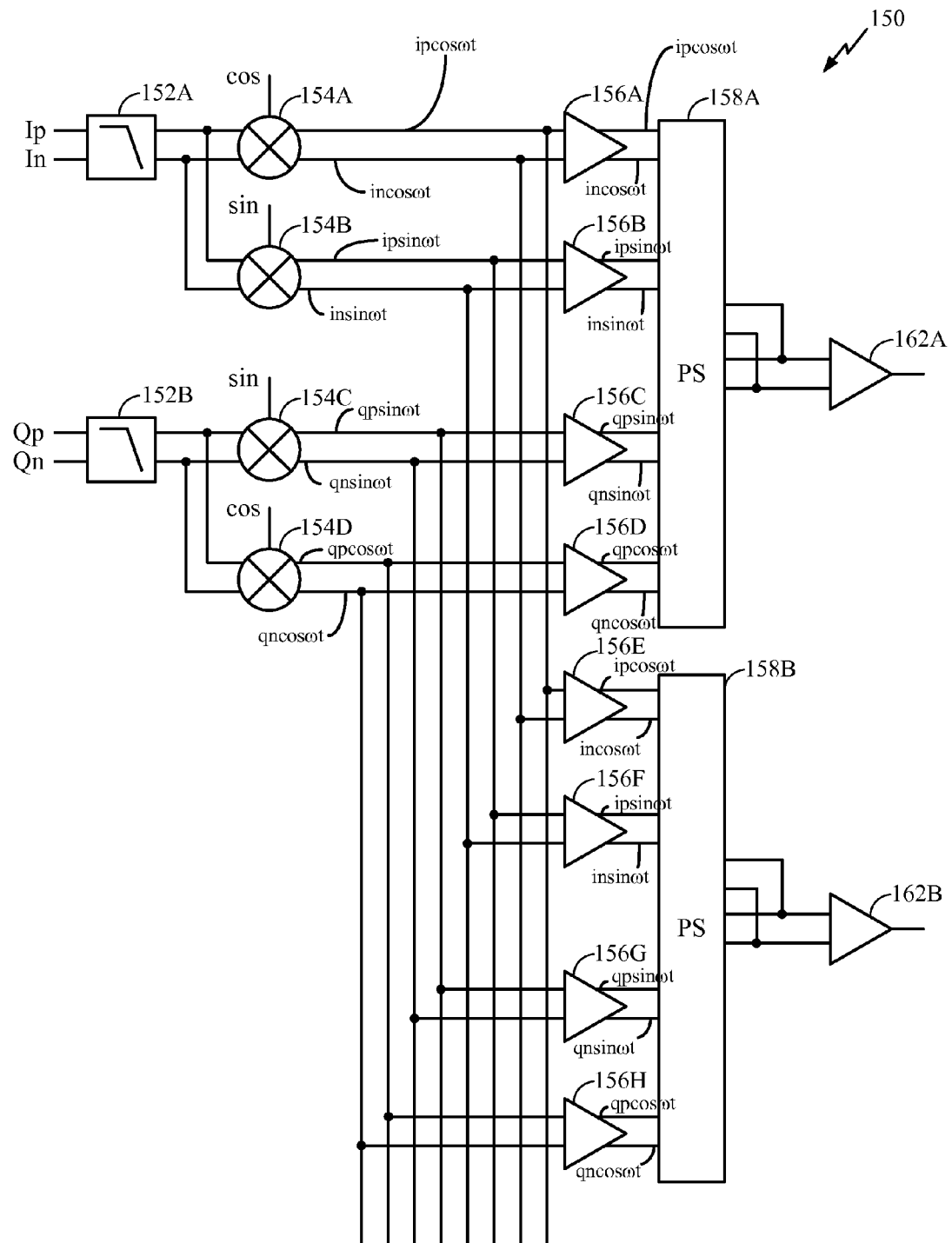
FIG. 2A illustrates a device configured for directional signal transmission, according to an exemplary embodiment of the present invention.

FIG. 2A illustrates a device 150, in accordance with an exemplary embodiment of the present invention. Device 150, which is configured for directional signal transmission (i.e., beamforming), includes two filters 152, four mixers 154, eight driver amplifiers 156, two phase shifters 158, and two power amplifiers 162. More specifically, in the exemplary embodiment illustrated in FIG. 2A, device 150 includes filters 152A and 152B, mixers 154A-154D, driver amplifiers 156A-156H, RF phase shifters 158A and 158B, and power amplifiers 162A and 162B. It is noted that device 150 includes two antenna branches (i.e., each power amplifier 162A and 162B being associated with an antenna branch). Further, in accordance with an exemplary embodiment of the present invention, regardless of the number of antenna branches, device 150 may only require four mixers (i.e., mixers 154A-154D). It is noted that phase shifters 158A and 158B may each comprise one of the phase shifters described below (i.e., phase shifter 220, phase shifter 240, phase shifter 250, phase shifter 280, or phase shifter 290).

During a contemplated operation of device 150, in-phase signals (i.e., signals "Ip" and "In") may be received at filter 152A and quadrature signals (i.e., signals "Qp" and "Qn") may be received at filter 152B. Further, each filtered signal (i.e., filtered signals Ip and In and filtered signals Qp and Qn) is conveyed to an associated mixer (i.e., mixer 154A-D) and then to an associated driver amplifier (i.e., driver amplifier 156A-H). More specifically, in-phase signal Ip is mixed with a cosine wave at mixer 154A to generate signal ip cos ωt and a sine wave at mixer 154B to generate ip sin ωt, wherein w is the angular frequency. Further, in-phase signal In is mixed with a cosine wave at mixer 154 to generate signal in cos ωt and a sine wave at mixer 154B to generate in sin ωt. In addition, quadrature signal Qp is mixed with a sine wave at mixer 154C to generate signal qp sin ωt and a cosine wave at mixer 154D to generate qp cos ωt. Further, in-phase signal Qn is mixed with a sine wave at mixer 154C to generate signal qn sin ωt and a cosine wave at mixer 154D to generate qn cos ωt.

Moreover, signals ip cos ωt and in cos ωt may be conveyed to each of driver amplifier 156A and driver amplifier 156E, signals ip sin ωt and in sin ωt may be conveyed to each of driver amplifier 156B and driver amplifier 156F, signals qp sin ωt and qn sin ωt may be conveyed to each of driver amplifier 156C and driver amplifier 156G, and signals qp cos ωt and qn cos ωt may be conveyed to each of driver amplifier 156D and driver amplifier 156H.

Further, an output of each driver amplifier 156 is conveyed to phase shifter 158. It is noted that each of driver amplifier 156A and driver amplifier 156E may convey a pair of signals (e.g., ip cos ωt and in cos ωt) to respective phase shifters 158A and 158B. Further, each of driver amplifier 156B and driver amplifier 156F may convey a pair of signals (e.g., ip sin ωt and in sin ωt) to respective phase shifters 158A and 158B. Additionally, each of driver amplifier 156C and driver amplifier 156G may convey a pair of signals (e.g., qp sin ωt and qn sin ωt) to respective phase shifters 158A and 158B. Moreover, each of driver amplifier 156D and driver amplifier 156H may convey a pair of signals (e.g., qp cos ωt and qn cos ωt) to respective phase shifters 158A and 158B.

After processing the received signals, as will be described in more detail below, each of RF phase shifter 158A and RF phase shifter 158B may output rotated in-phase and quadrature signals to a respective power amplifier 162. More specifically, phase shifter 158A may convey rotated in-phase (F'p and I'n) and quadrature (Q'p and Q'n) signals to power amplifier 162A and phase shifter 158B may convey rotated in-phase (Fp and I'n) and quadrature (Q'p and Q'n) signals to power amplifier 162B.

Figure 2B:
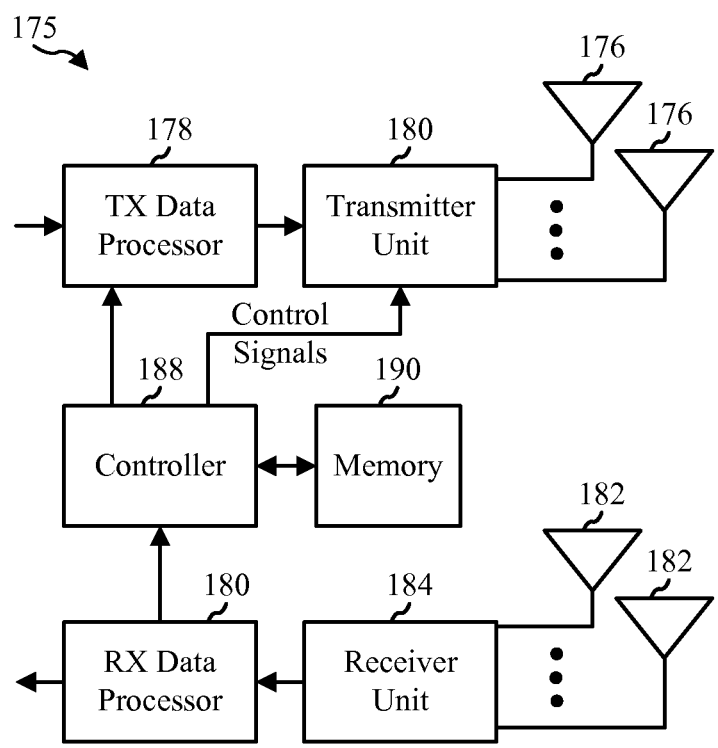
FIG. 2B illustrates a device including a transmitter unit and a receiver unit, in accordance with an exemplary embodiment of the present invention.

FIG. 2B shows a block diagram of an embodiment of a device 175. Device 175 may include one or more antennas 176. During signal transmission, a transmit (TX) data processor 178 receives and processes data and generates one or more streams of data. The processing by TX data processor 178 is system dependent and may include, e.g., encoding, interleaving, symbol mapping, and so on. For a CDMA system, the processing typically further includes channelization and spectral spreading. TX data processor 178 also converts each stream of data into a corresponding analog baseband signal. A transmitter unit 180 receives and conditions (e.g., amplifies, filters, and frequency upconverts) the baseband signals from TX data processor 178 and generates an RF output signal for each antenna used for data transmission. The RF output signals are transmitted via antennas 176. During signal reception, one or more signals may be received by antennas 182, conditioned and digitized by a receiver unit 184, and processed by an RX data processor 186. Controller 188 may direct the operation of various processing units within device 175. Further, memory units 190 may store data and program codes for controllers 188. It is noted that transmitter unit 180 may include device 150, which is illustrated in FIG. 2A.

Figure 3:
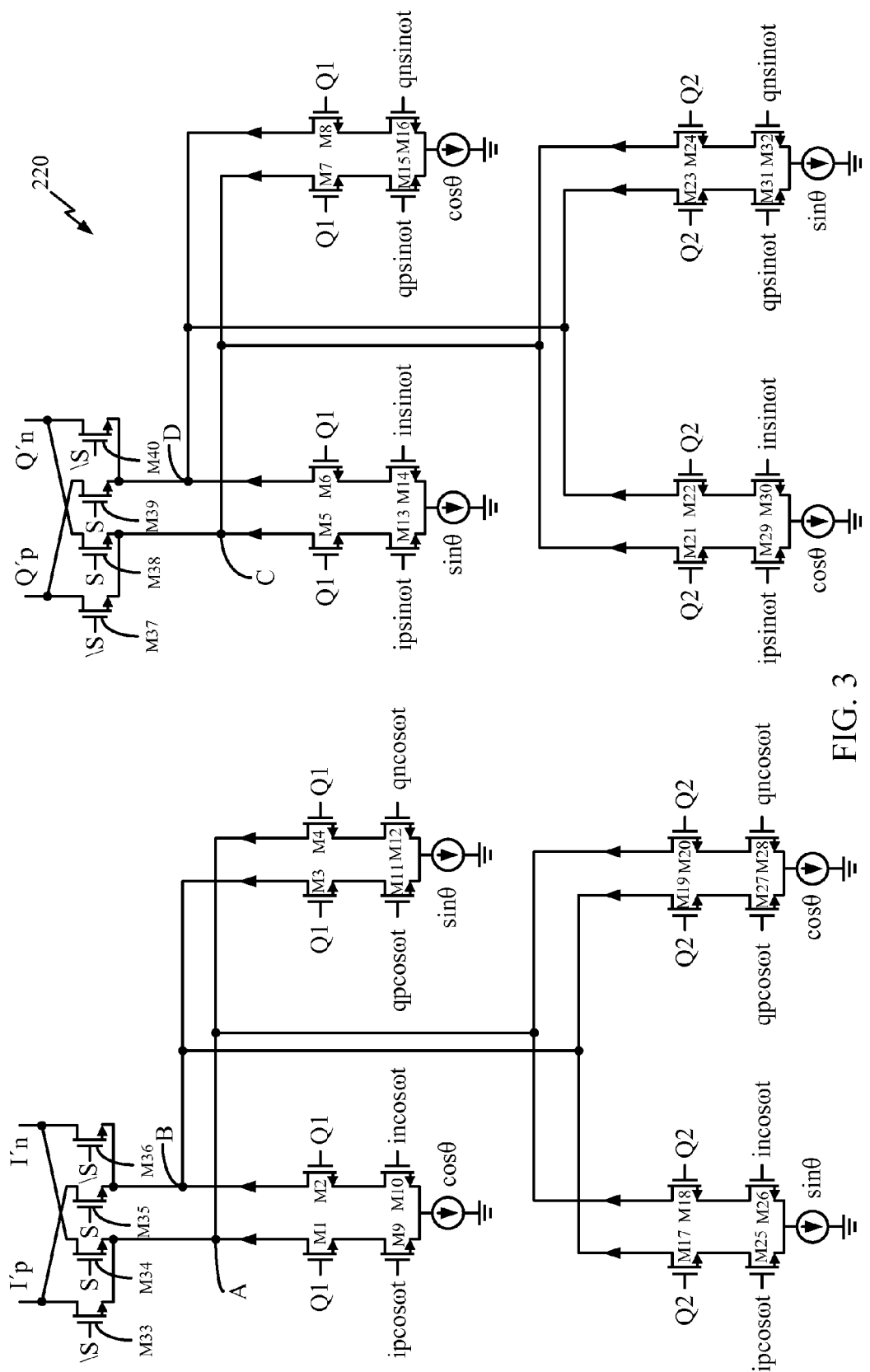
FIG. 3 illustrates a phase shifter, according to an exemplary embodiment of the present invention.

FIG. 3 illustrates a RF phase shifter 220, according to an exemplary embodiment of the present invention. As will be appreciated by a person having ordinary skill in the art, phase shifter 220 is configured to rotate in-phase and quadrature (IQ) data (i.e., an envelope signal). Further, it is noted that rotation of a carrier signal is not required for phase shifter 220 to perform phase rotation. Phase shifter 220 includes a plurality of switching elements M1-M40. Although the switching elements M1-M40 are illustrated in FIG. 3 as transistors, each of switching elements M1-M40 may comprise any known and suitable switching elements. It is noted that a "switching element" may also be referred to herein as a "switch." As illustrated in FIG. 3, each of switching elements M1, M4, M18, and M20 have a drain coupled to a node A and a source coupled to a drain of another switching element. Further, each of switching elements M2, M3, M17 and M19 have a drain coupled to a node B and a source coupled to a drain of another switching element. Moreover, each of switching elements M5, M7, M21 and M24 have a drain coupled to a node C and a source coupled to a drain of another switching element. Additionally, each of switching elements M6, M8, M22 and M23 have a drain coupled to a node D and a source coupled to a drain of another switching element. Each of switching elements M9-M16 and switching elements M25-M32 have a drain coupled to a source of another transistor and a source coupled to a variable current source (i.e., cos θ or sin θ).

Furthermore, switching elements M33 and M34 have a source coupled to node A and switching elements M35 and M36 have a source coupled to node B. Moreover, switching elements M33 and M35 have a drain coupled to a first output I'p and switching elements M34 and M36 have a drain coupled to a second output I'n. Switching elements M37 and M38 have a source coupled to node C and switching elements M39 and M40 have a source coupled to node D. Moreover, switching elements M37 and M39 have a drain coupled to a third output Q'p and switching elements M38 and M40 have a drain coupled to a fourth output Q'n.

Further, switching elements M1-M8, M17-M24, and M33-M40 are each configured to receive a control signal at a gate. More specifically, switching elements M1-M8 are each configured to receive a first control signal (e.g., "Q1") at their respective gates, switching elements M17-M24 are each configured to receive a second control signal (e.g., "Q2") at their respective gates, switching elements M33, M36, M37 and M40 are each configured to receive a third control signal (e.g., "\S") at their respective gates, and switching elements M34, M35, M38 and M39 are each configured to receive a fourth control signal (e.g., "S") at their respective gates.

Additionally, switching elements M9 and M25 are each configured to receive signal Ip cos ωt at a gate, switching elements M10 and M26 are each configured to receive signal in cos ωt at a gate, switching elements M11 and M27 are each configured to receive signal qp cos ωt at a gate, switching elements M12 and M28 are each configured to receive signal qn cos ωt at a gate, switching elements M13 and M29 are each configured to receive signal ip sin ωt at a gate, switching elements M14 and M30 are each configured to receive signal in sin ωt at a gate, switching elements M15 and M31 are each configured to receive signal qp sin ωt at a gate, and switching elements M16 and M32 are each configured to receive signal qn sin ωt at a gate.

As configured, phase shifter 220 may provide for for quadrant selection, as well as signal combination and signal rotation. It is noted that one or more quadrants may be selected based on a desired phase shift. As one example, if quadrant one is selected, control signal Q1 is high "1", control signal Q2 is low "0", control signal S is low "0", and control signal \S is high "1". Accordingly, if quadrant one is selected, switching elements M1-M8, M33, M36, M37, and M40 are in a conductive state, switching elements M17-M24, M34, M35, M38, and M39 are in a non-conductive state, first output I'p is coupled to node A, second output I'n is coupled to node B, third output Q'p is coupled to node C, and fourth output Q'n is coupled to node D. As another example, if quadrant two is selected, control signal Q1 is low "0", control signal Q2 is high "1", control signal S is low "0", and control signal \S is high "1". Accordingly, if quadrant two is selected, switching elements M1-M8, M34, M35, M38, and M39 are in a non-conductive state, switching elements M17-M24, M33, M36, M37, and M40 are in a conductive state, first output I'p is coupled to node A, second output I'n is coupled to node B, third output Q'p is coupled to node C, and fourth output Q'n is coupled to node D.

Further, if quadrant three is selected, control signal Q1 is high "1", control signal Q2 is low "0", control signal S is high "1", and control signal \S is low "0". Accordingly, if quadrant three is selected, switching elements M1-M8, M34, M35, M38, and M39 are in a conductive state, switching elements M17-M24, M33, M36, M37, and M40 are in a non-conductive state, first output I'p is coupled to node B, second output I'n is coupled to node A, third output Q'p is coupled to node D, and fourth output Q'n is coupled to node C. Moreover, if quadrant four is selected, control signal Q1 is low "0", control signal Q2 is high "1", control signal S is high "1", and control signal \S is low "0". Accordingly, if quadrant four is selected, switching elements M1-M8, M33, M36, M37, and M40 are in a non-conductive state, switching elements M17-M24, M34, M35, M38, and M39 are in a conductive state, first output I'p is coupled to node B, second output I'n is coupled to node A, third output Q'p is coupled to node D, and fourth output Q'n is coupled to node C.

As will be appreciated by a person having ordinary skill, phase shifter 220 may utilize two digital-to-analog (DAC) converters to generate cos θ or sin θ, wherein θ ranges from substantially zero to ninety degrees. During a contemplated operation of phase shifter 220, phase shifting may be achieved by, for example, using a DAC to generate a required phase shift current, whose magnitude is scaled as cos θ or sin θ. Further, switching elements M1 to M40 may be used for signal switching and combing. As a result, a final output is the phase rotated signal as shown in equation (5) and equation (6), as shown above.

Figure 4A:
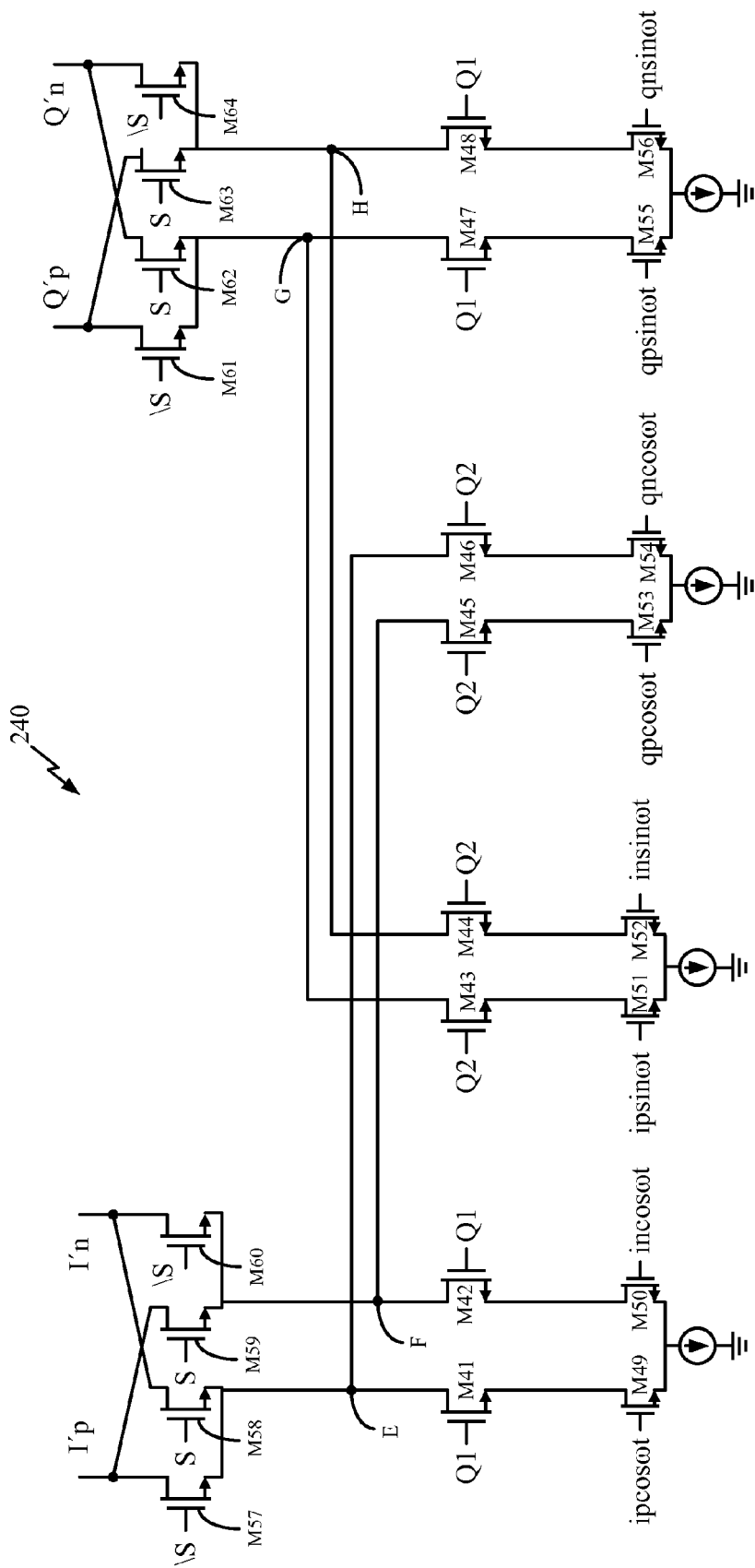
FIG. 4A illustrates another phase shifter having a voltage input, in accordance with an exemplary embodiment of the present invention.

It is noted that phase shifter 220 illustrated in FIG. 3 may be configured for high resolution cases (e.g., above ninety degrees). However, in some cases, resolution greater than ninety degrees may not be required and, thus, a simplified architecture may be utilized. FIG. 4A is another phase shifter 240, in accordance with an exemplary embodiment of the present invention. As will be appreciated by a person having ordinary skill in the art, phase shifter 240 is configured to rotate in-phase and quadrature (IQ) data (i.e., an envelope signal). Further, it is noted that rotation of a carrier signal is not required for phase shifter 240 to perform phase rotation. Although phase shifter 240 is not limited to cases wherein a resolution of ninety degrees or less is desired, phase shifter 240 provides for simplified circuitry in cases that do not require a resolution greater than ninety degrees. Phase shifter 240 includes a plurality of switching elements M41-M64. As noted above with reference to phase shifter 220, although the switching elements M41-M64 are illustrated in FIG. 4A as transistors, switching elements M41-M64 may comprise any suitable switching elements. As illustrated in FIG. 4A, each of switching elements M41 and M46 have a drain coupled to a node E. In addition, each of switching elements M42 and M45 have a drain coupled to a node F. Moreover, each of switching elements M43 and M47 have a drain coupled to a node G. Additionally, each of switching elements M44 and M48 have a drain coupled to a node H. Moreover, switching elements M41-M48 have a source coupled to another transistor. Each of switching elements M49-M56 have a drain coupled to a source of another transistor and a source coupled to a constant current source.

Switching elements M57 and M58 have a source coupled to node E and switching elements M59 and M60 have a source coupled to node F. Further, switching elements M57 and M59 have a drain coupled to a first output Ip and switching elements M58 and M60 have a drain coupled to a second output I'n. Switching elements M61 and M62 have a source coupled to node G and switching elements M63 and M64 have a source coupled to node H. Moreover, switching elements M61 and M63 have a drain coupled to a third output Q'p and switching elements M62 and M64 have a drain coupled to a fourth output Q'n.

Further, switching elements M41-M48 and M57-M64 are each configured to receive a control signal at a gate. More specifically, switching elements M41, M42, M47, and M48 are configured to receive a first control signal (e.g., "Q1") at their respective gates, switching elements M43-M46 are configured to receive a second control signal (e.g., "Q2") at their respective gates, switching elements M57, M60, M61, and M64 are configured to receive a third control signal (e.g., "\S") at their respective gates, and switching elements M58, M59, M62, and M63 are configured to receive a fourth control signal (e.g., "S") at their respective gates.

Additionally, switching element M49 is configured to receive signal ip cos ωt at a gate, switching element M50 is configured to receive signal in cos ωt at a gate, switching element M51 is configured to receive signal ip sin ωt at a gate, switching element M52 is configured to receive signal in sin ωt at a gate, switching element M53 is configured to receive signal qp cos ωt at a gate, switching element M54 is configured to receive signal qn cos ωt at a gate, switching element M55 configured to receive signal qp sin ωt at a gate, and switching elements M56 is configured to receive signal qn sin ωt at a gate.

As configured, phase shifter 240 may enable for quadrant selection, as well as provide for signal combination and rotation. It is noted that one or more quadrants may be selected based on a desired phase shift. As one example, if quadrant one is selected, control signal Q1 is high "1", control signal Q2 is low "0", control signal S is low "0", and control signal \S is high "1". Accordingly, if quadrant one is selected, switching elements M41, M42, M47, M48, M57, M60, M61, and M64 are in a conductive state, switching elements M43-M46, M58, M59, M62, and M63 are in a non-conductive state, first output I'p is coupled to node E, second output I'n is coupled to node F, third output Q'p is coupled to node G, and fourth output Q'n is coupled to node H. As another example, if quadrant two is selected, control signal Q1 is low "0", control signal Q2 is high "1", control signal S is low "0", and control signal \S is high "1". Accordingly, if quadrant two is selected, switching elements M41, M42, M47, M48, M57, M60, M61, and M64 are in a non-conductive state, switching elements M43-M46, M58, M59, M62, and M63 are in a conductive state, first output I'p is coupled to node A, second output I'n is coupled to node B, third output Q'p is coupled to node C, and fourth output Q'n is coupled to node D.

Further, if quadrant three is selected, control signal Q1 is high "1", control signal Q2 is low "0", control signal S is high "1", and control signal \S is low "0". Accordingly, if quadrant three is selected, switching elements M41, M42, M47, M48, M58, M59, M62, and M63 are in a conductive state, switching elements M43-M46, M57, M60, M61, and M64 are in a non-conductive state, first output I'p is coupled to node F, second output I'n is coupled to node E, third output Q'p is coupled to node H, and fourth output Q'n is coupled to node G. Moreover, if quadrant four is selected, control signal Q1 is low "0", control signal Q2 is high "1", control signal S is high "1", and control signal \S is low "0". Accordingly, if quadrant four is selected, switching elements M41, M42, M47, M48, M57, M60, M61, and M64 are in a non-conductive state, switching elements M43-M46, M58, M59, M62, and M63 are in a conductive state, first output I'p is coupled to node F, second output I'n is coupled to node E, third output Q'p is coupled to node H, and fourth output Q'n is coupled to node G.

Figure 4B:
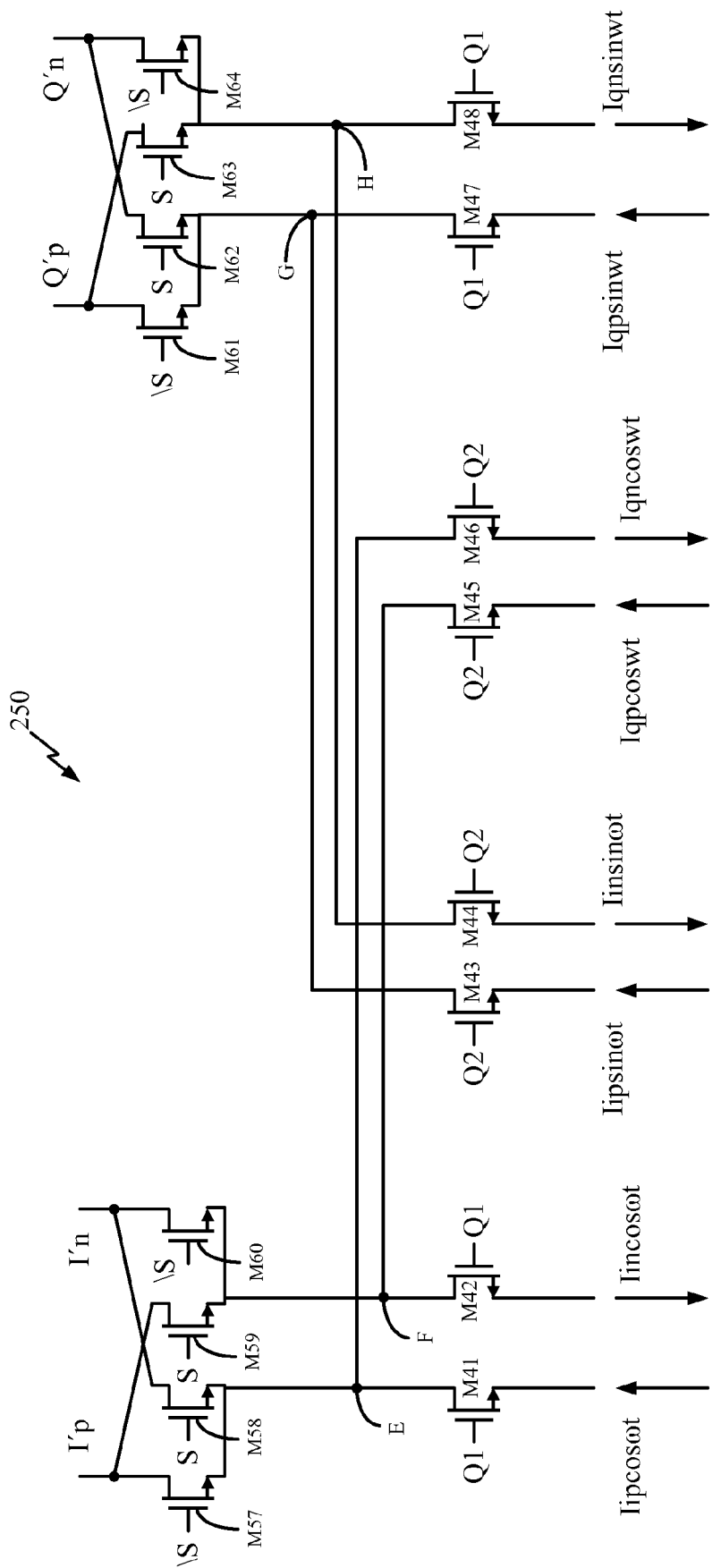
FIG. 4B illustrates the phase shifter of FIG. 4A having a current input, in accordance with an exemplary embodiment of the present invention.

As will be appreciated by a person having ordinary skill in the art FIG. 4A illustrates a phase shifter having voltage inputs. FIG. 4B illustrates a phase shifter 250, which is similar to phase shifter 240 illustrated in FIG. 4A, except phase shifter 250 includes current inputs, rather than voltage inputs.

Figure 5A:
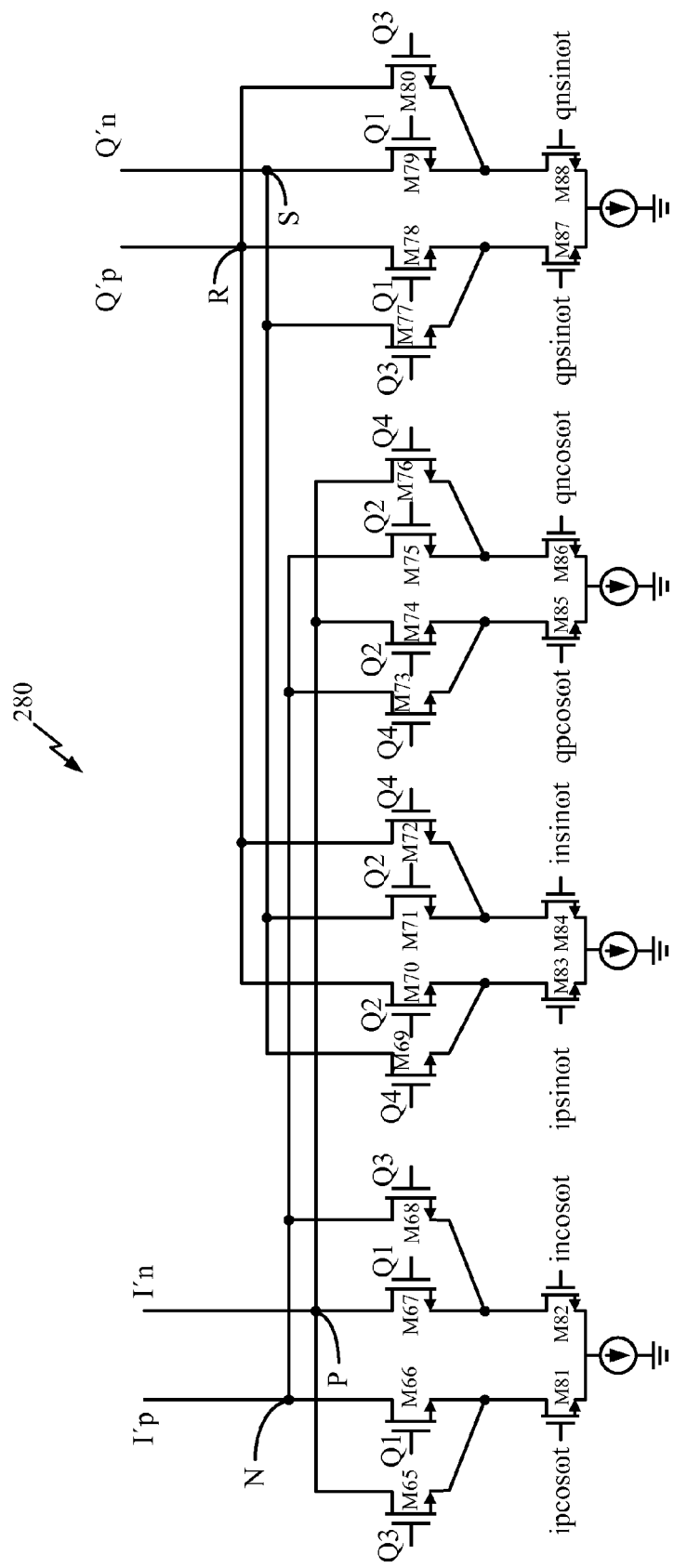
FIG. 5A illustrates yet another phase shifter having a voltage input, in accordance with an exemplary embodiment of the present invention.

FIG. 5A is another phase shifter 280, in accordance with an exemplary embodiment of the present invention. As will be appreciated by a person having ordinary skill in the art, phase shifter 280 is configured to rotate in-phase and quadrature (IQ) data (i.e., an envelope signal). Further, it is noted that rotation of a carrier signal is not required for phase shifter 280 to perform phase rotation. Although phase shifter 280 is not limited to cases wherein a resolution of ninety degrees or less is desired, phase shifter 280 provides for simplified circuitry in cases that do not require a resolution greater than ninety degrees. Phase shifter 280 includes a plurality of switching elements M65-M88. As noted above with reference to phase shifter 220 and phase shifter 240, although the switching elements M65-M88 are illustrated in FIG. 5A as transistors, switching elements M65-M88 may comprise any suitable switching elements. As illustrated in FIG. 5A, each of switching elements M66, M68, M73, and M75 has a drain coupled to a node N, which is coupled to an output I'p. In addition, each of switching elements M65, M67, M74, and M76 has a drain coupled to a node P, which is coupled to an output I'n. Moreover, each of switching elements M70, M72, M78, and M80 has a drain coupled to a node R, which is coupled to an output Q'p. Additionally, each of switching elements M69, M71, M77, and M79 has a drain coupled to a node S, which is coupled to an output Q'n. Moreover, switching elements M65-M80 have a source coupled to another transistor. Each of switching elements M81-M88 have a drain coupled to a source of another transistor and a source coupled to a constant current source.

Further, each of switching elements M65-M80 is configured to receive a control signal at a gate. More specifically, switching elements M66, M67, M78, and M79 are configured to receive a first control signal (e.g., "Q1") at their respective gates, switching elements M70, M71, M74, and M75 are configured to receive a second control signal (e.g., "Q2") at their respective gates, switching elements M65, M68, M77, and M80 are configured to receive a third control signal (e.g., "Q3") at their respective gates, and switching elements M69, M72, M73, and M76 are configured to receive a fourth control signal (e.g., "Q4") at their respective gates.

Additionally, switching element M81 is configured to receive signal ip cos ωt at a gate, switching element M82 is configured to receive signal in cos ωt at a gate, switching element M83 is configured to receive signal ip sin ωt at a gate, switching element M84 is configured to receive signal in sin ωt at a gate, switching element M85 is configured to receive signal qp cos ωt at a gate, switching element M86 is configured to receive signal qn cos ωt at a gate, switching element M87 configured to receive signal qp sin ωt at a gate, and switching elements M88 is configured to receive signal qn sin ωt at a gate.

As configured, phase shifter 280 may enable for quadrant selection, as well as provide for signal combination and rotation. It is noted that one or more quadrants may be selected based on a desired phase shift. As one example, if quadrant one is selected, control signal Q1 is high "1", and each of control signals Q2, Q3, and Q4 are low "0". Accordingly, if quadrant one is selected, switching elements M66, M67, M78, and M79 are in a conductive state and switching elements M65, M68-M77, and M80 are in a non-conductive state. As another example, if quadrant two is selected, control signals Q1, Q3, and Q4 are each low "0" and control signal Q2 is high "1". Accordingly, if quadrant two is selected, switching elements M70, M71, M74, and M75 are in a conductive state and switching elements M65-M69, M72, M73, and M76-M80 are in a non-conductive state.

Further, if quadrant three is selected, control signal Q1 is high "1", control signal Q2 is low "0", control signal S is high "1", and control signal \S is low "0". Accordingly, if quadrant three is selected, switching elements M65, M68, M77, and M80 are in a conductive state and switching elements M66, M67, M69-M76, M78, and M79 are in a non-conductive state. Moreover, if quadrant four is selected, control signal Q1 is low "0", control signal Q2 is high "1", control signal S is high "1", and control signal \S is low "0". Accordingly, if quadrant four is selected, switching elements M65-M68, M70, M71, M74, M75, M77-M80 are in a non-conductive state and switching elements M69, M72, M73, and M76 are in a conductive state.

Phase shifter 240 and phase shifter 280 are special cases where the phase resolution is substantially 90 degrees or less. Under this condition, at 0 degrees, I=I' and Q=Q', at 90 degrees, I'=−Q and Q'=I, at 180 degrees, I'=−I and Q'=−Q, and at 270 degrees, I'=Q and Q'=−I. As a result, an accurate DACs to generate the scaled current of cos and sin because sin(90), sin(180), sin(0) sin(360), cos(90), cos(0), cos(180), and cos (270) are equal to 0, 1 or −1. Since only 0, 1 or −1 are required, the phase shifting procedure is simpler, as only one step is needed. Depending on the desired quadrant (i.e. a desired phase shift), Q1, Q2 Q3, or Q4 can be selected. The final output is the phase rotated signal as shown in equation (5) and equation (6), as shown above. It is noted that, in certain cases, both quadrant signals may be turned on to achieve substantially 45 degrees. For example, Q1=0 degrees, Q2=90 degrees, Q3=180 degrees, and Q4=270 degrees. In addition, if Q1 and Q2 are both turned on, substantially 45 degrees may be achieved. If Q2 and Q3 are both turned on, substantially 135 degrees may be achieved. Moreover, if Q3 and Q4 are both turned on, substantially 225 degrees may be achieved. Additionally, if Q4 and Q1 are both turned on, substantially 315 degrees may be achieved.

Figure 5B:
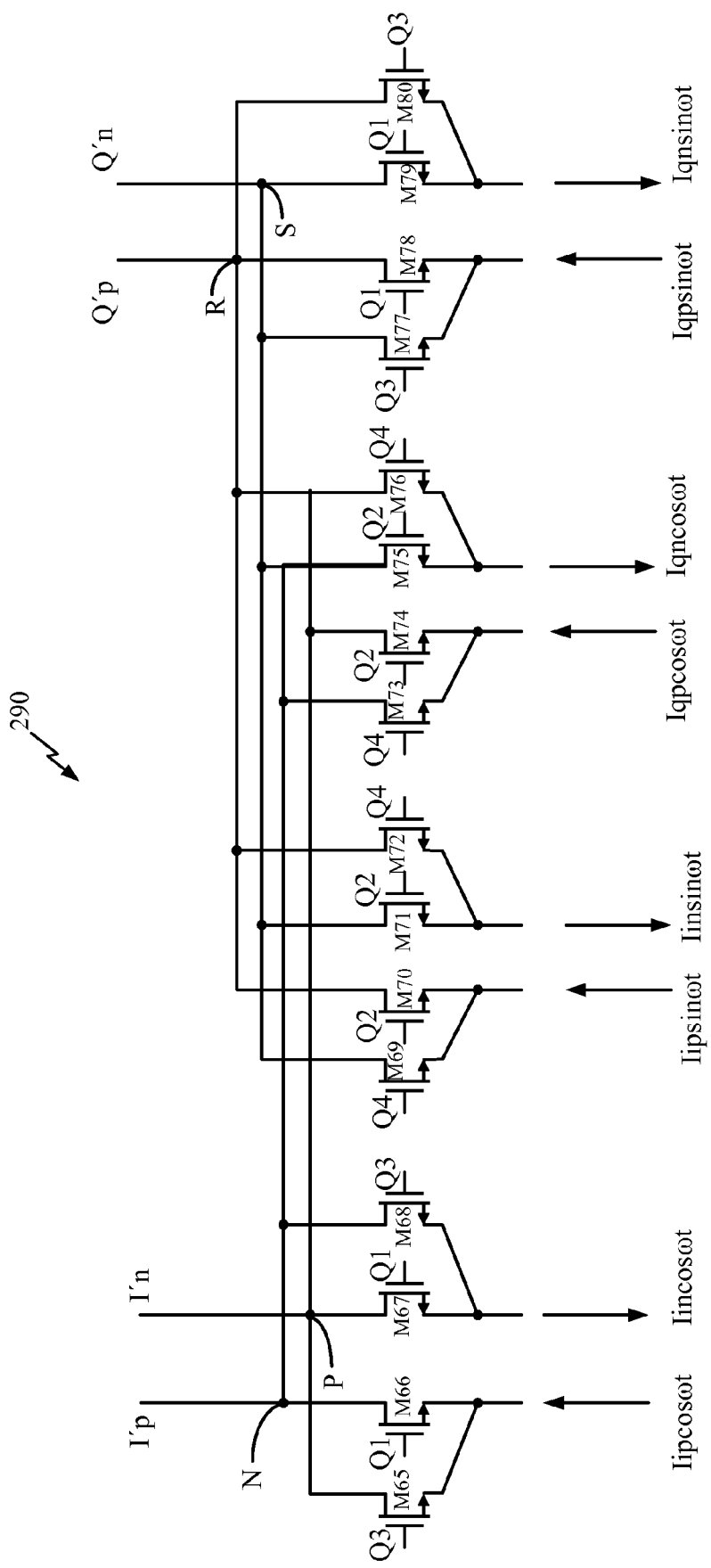
FIG. 5B illustrates the phase shifter of FIG. 5A having a current input, in accordance with an exemplary embodiment of the present invention.

As will be appreciated by a person having ordinary skill in the art FIG. 5A illustrates a phase shifter having voltage inputs. FIG. 5B illustrates a phase shifter 290, which is similar to phase shifter 280 illustrated in FIG. 5A, except phase shifter 290 includes current inputs, rather than voltage inputs.

Figure 7:
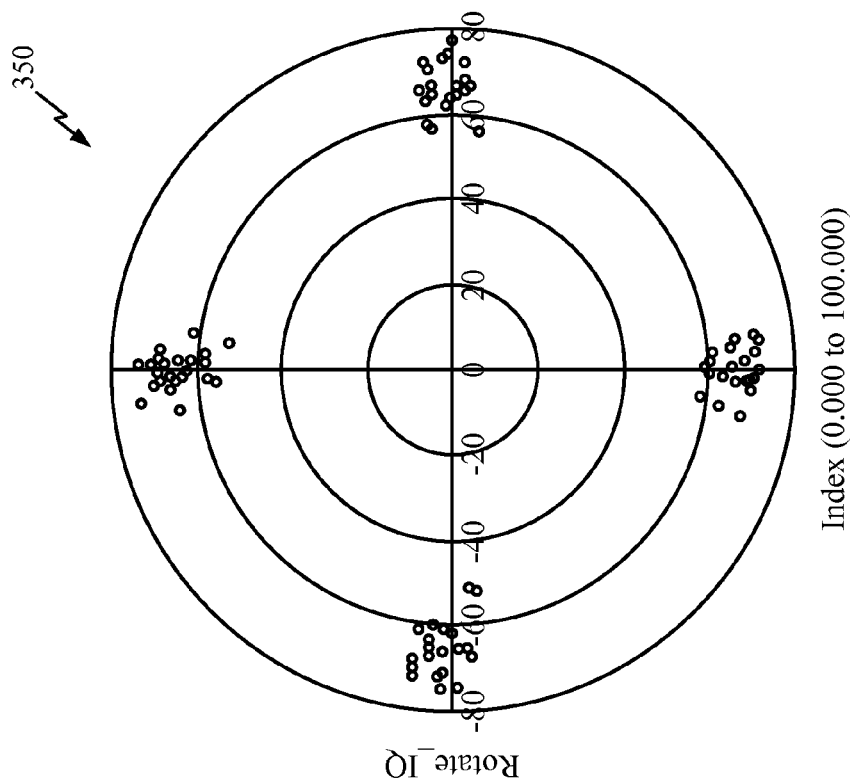
FIG. 7 is a plot depicting the in-phase and quadrature data of FIG. 8, after being rotated ninety degrees.
Figure 6:
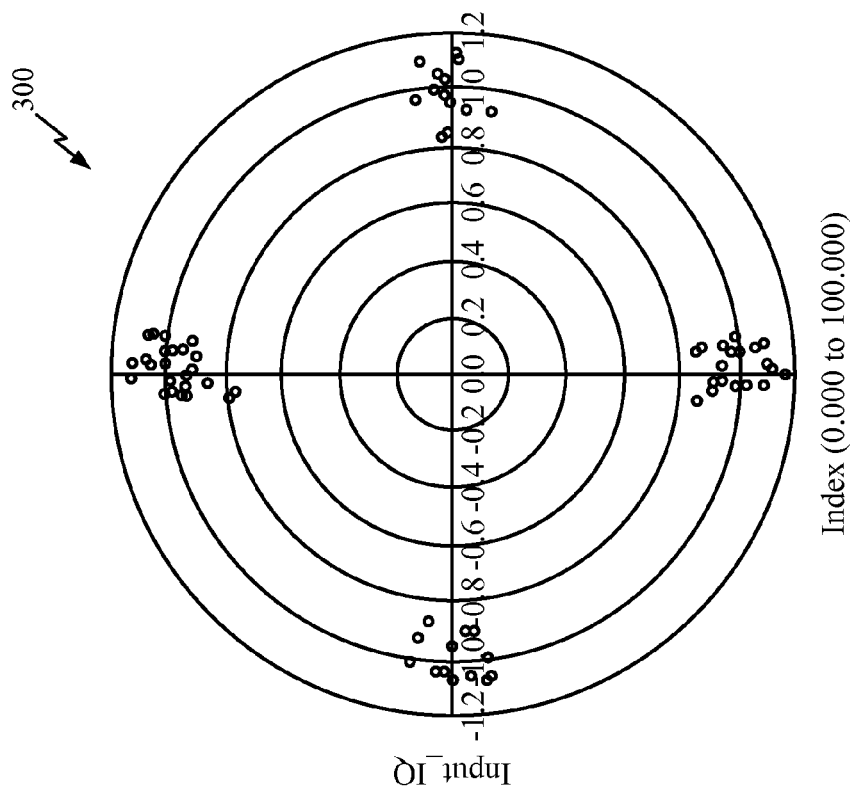
FIG. 6 is a plot depicting in-phase and quadrature data prior to being rotated.

FIG. 6 is a plot depicting in-phase and quadrature data prior to being rotated. FIG. 7 is a plot depicting the in-phase and quadrature data of FIG. 6, after being rotated ninety degrees.

Figure 8:
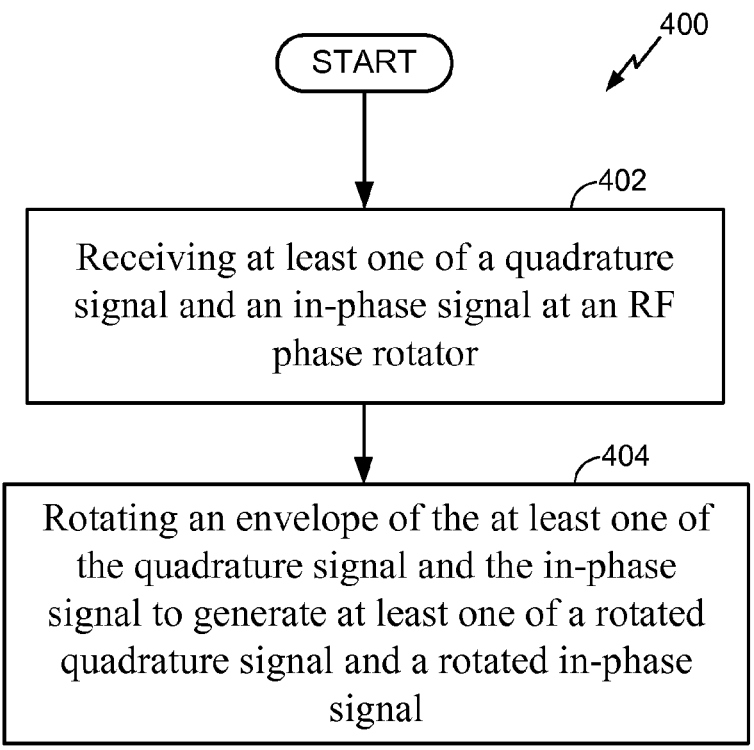
FIG. 8 is a flowchart illustrating a method, according to an exemplary embodiment of the present invention.

FIG. 8 is a flowchart illustrating a method 400, in accordance with one or more exemplary embodiments. Method 400 may include receiving at least one of a quadrature signal and an in-phase signal at an RF phase rotator (depicted by numeral 402). Method 400 may also include rotating an envelope of the at least one of a quadrature signal and the in-phase signal to generating at least one of a rotated quadrature signal and a rotated in-phase signal (depicted by numeral 404).

Figure 9:
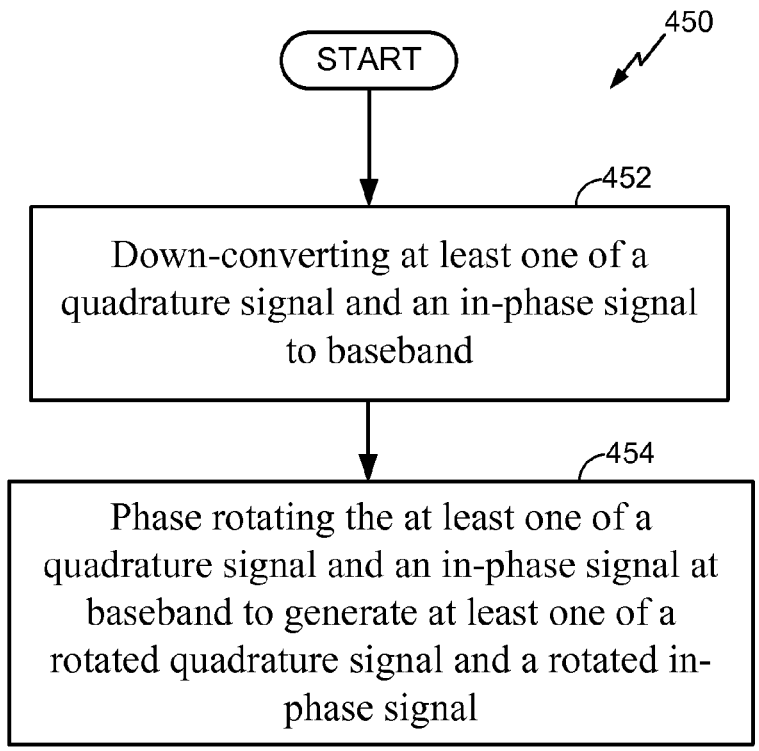
FIG. 9 is a flowchart illustrating another method, according to an exemplary embodiment of the present invention.

FIG. 9 is a flowchart illustrating another method 450, in accordance with one or more exemplary embodiments. Method 450 down-converting at least one of a quadrature signal and an in-phase signal to baseband (depicted by numeral 452). Further, method 450 may include phase rotating the at least one of the quadrature signal and the in-phase signal at baseband to generate at least one of a rotated quadrature signal and a rotated in-phase signal (depicted by numeral 454).

Exemplary embodiments, as described herein, may be suitable for various modulation techniques including, but not limited to, QPSK, 16-QAM, and 64-QAM. Further, as noted above, embodiments of the present invention may be configured to use two pair of switches regardless of a number of antennas, utilize switches to perform signal combination and phase rotation, and utilize a DAC to generate $\sin\theta$ and $\cos\theta$ in high resolution cases. Accordingly, in comparison to conventional beamforming, a number of mixers may be reduced and, therefore, in-phase and quadrature calibrations may be simplified. Further, exemplary embodiments of the present invention, in comparison to conventional systems, may reduce required area and power and enhance linearity and bandwidth. Additionally, it is noted that exemplary embodiments of the present invention may provide for rotation of in-phase and quadrature data (e.g., an envelope signal), and not a carrier signal, as done in conventional systems.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the exemplary embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the exemplary embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosed exemplary embodiments is provided to enable any person skilled in the art to make or use the present invention. Various modifications to these exemplary embodiments will be readily apparent to those skilled in the art, and the generic principles defined herein may be applied to other embodiments without departing from the spirit or scope of the invention. Thus, the present invention is not intended to be limited to the exemplary embodiments shown herein but is to be accorded the widest scope consistent with the principles and novel features disclosed herein.

What is claimed is:

1. A device, comprising:
   a plurality of mixers, each mixer configured to convey at least one of a quadrature signal and an in-phase signal; and
   at least one RF phase rotator coupled to an output of each of the plurality of mixers and configured for rotating independent of a carrier signal an envelope of the at least one of the quadrature signal and the in-phase signal to generate at least one of a rotated in-phase signal and a rotated quadrature signal.

2. The device of claim 1, the plurality of mixers comprising four mixers.

3. The device of claim 1, further comprising a plurality of filters, each filter of the plurality of filters coupled to two mixers of the plurality of mixers.

4. The device of claim 1, further comprising a plurality of driver amplifiers coupled to an RF phase rotator of the at least one RF phase rotator.

5. The device of claim 1, each RF phase rotator of the at least one phase RF rotator associated with an antenna path.

6. The device of claim 1, each RF phase rotator of the at least one phase RF rotator comprising:
   a first plurality of switches for receiving a plurality of input signals; and
   a second plurality of switches configured for selecting a desired quadrant.

7. The device of claim 6, further comprising a third plurality of switches for generating an output.

8. A device, comprising:
   a plurality of mixers, each mixer configured to receive at least one of a quadrature signal and in-phase signal; and
   at least one RF phase rotator coupled to an output of each of the plurality of mixers and configured for rotating independent of a carrier signal an envelope of the at least one of the quadrature signal and the in-phase signal to generate at least one of a rotated quadrature signal and a rotated in-phase signal, each RF phase rotator of the at least one comprising:
   a first plurality of switches for receiving a plurality of input signals; and
   a second plurality of switches configured for selecting a desired quadrant.

9. The device of claim 8, the plurality of mixers comprising four mixers.

10. The device of claim 8, the phase rotator further comprising one of a constant current source and a variable current source coupled to the first plurality of switches.

11. The device of claim 8, each switch of the first plurality of switches and the second plurality of switches comprising a transistor.

12. The device of claim 8, each RF phase rotator of the at least one phase RF rotator associated with an antenna path.

13. The device of claim 8, each switch of the second plurality of switches coupled to a digital-to-analog converter.

14. An RF phase rotating device, comprising:
    a plurality of switches configured for quadrant selection; and
    a plurality of inputs, each switch of the plurality of switches coupled between an input of the plurality of inputs and an output of a plurality of outputs;
    the phase rotating device configured for rotating independent of a carrier signal an envelope of at least one of a quadrature signal and in-phase signal.

15. The device of claim 14, further comprising a second plurality of switches for receiving a plurality of input signals.

16. A method, comprising:
    receiving at least one of a quadrature signal and an in-phase signal at an RF phase rotator; and
    rotating independent of a carrier signal an envelope of the at least one of the quadrature signal and the in-phase signal to generate at least one of a rotated quadrature signal and a rotated in-phase signal.

17. The method of claim 16, further comprising conveying a control signal to one or more switches to select a desired quadrant.

18. The method of claim 16, the rotating comprising varying a current source with the RF phase rotator.

19. A method, comprising:
    down-converting at least one of a quadrature signal and an in-phase signal to baseband; and
    rotating independent of a carrier signal an envelope of the at least one of a quadrature signal and an in-phase signal at baseband to generate at least one of a rotated quadrature signal and a rotated in-phase signal.

20. The method of claim 19, the rotating comprising conveying a signal to at least one switch of a plurality of switches to select a desired quadrant.

21. The method of claim 19, further comprising conveying at least one of a down-converted quadrature signal and a down-converted in-phase signal to a switch of a plurality of switches.

22. The method of claim 19, the rotating comprising conveying a control signal to at least one switch of a plurality of switches for selecting one or more output signals comprising the rotated quadrature signal or the rotated in-phase signal.

23. A device, comprising:
    means for receiving at least one of a quadrature signal and an in-phase signal at an RF phase rotator; and means for rotating independent of a carrier signal an envelope of the at least one of the quadrature signal and the in-phase signal to generate at least one of a rotated quadrature signal and a rotated in-phase signal.

24. A device, comprising:
means for down-converting at least one of a quadrature signal and an in-phase signal to baseband; and
means for rotating independent of a carrier signal an envelope of the at least one of a quadrature signal and in-phase signal to generate at least one of a rotated quadrature signal and a rotated in-phase signal.

* * * * *